(12) United States Patent
Vekhter et al.

(10) Patent No.: US 10,162,461 B2
(45) Date of Patent: Dec. 25, 2018

(54) CAPACITIVE SENSING PATENT

(71) Applicants: Josh Vekhter, Williamsville, NY (US);
Akivo Vekhter, Williamsville, NY (US)

(72) Inventors: Josh Vekhter, Williamsville, NY (US);
Akivo Vekhter, Williamsville, NY (US)

( * ) Notice: Subject to any disclaimer, the term of this patent is extended or adjusted under 35 U.S.C. 154(b) by 21 days.

(21) Appl. No.: 15/605,142

(22) Filed: May 25, 2017

(65) Prior Publication Data

US 2017/0344178 A1    Nov. 30, 2017

Related U.S. Application Data

(60) Provisional application No. 62/341,593, filed on May 25, 2016.

(51) Int. Cl.
*G06F 3/041* (2006.01)
*H03K 17/96* (2006.01)
*G06F 3/044* (2006.01)
*G09G 3/30* (2006.01)
*G09G 3/3208* (2016.01)

(52) U.S. Cl.
CPC ............ *G06F 3/0416* (2013.01); *G06F 3/044* (2013.01); *G09G 3/30* (2013.01); *G09G 3/3208* (2013.01); *H03K 17/962* (2013.01); *G09G 2330/02* (2013.01)

(58) Field of Classification Search
CPC ..... G06F 3/0416; G06F 3/044; G09G 3/3208; G09G 3/30; G09G 2330/02; H03K 17/962
See application file for complete search history.

(56) References Cited

U.S. PATENT DOCUMENTS 3,207,905 A   9/1965  Bray
3,351,347 A   11/1967 Smith
5,019,748 A   5/1991  Appelberg
(Continued)

FOREIGN PATENT DOCUMENTS

WO   WO2000055879 A1   9/2000
WO   WO2011028361 A1   3/2011

OTHER PUBLICATIONS

Simon Olberding et al., "PrintScreen: Fabricating Highly Customizable Thin-film Touch-Displays", UIST '14, Oct. 2014, 10 pages.

*Primary Examiner* — Premal R Patel
(74) *Attorney, Agent, or Firm* — Fish & Richardson P.C.

(57) ABSTRACT

An electronic device that includes a first switch, a second switch, a capacitive sensing circuit, and control circuitry. The first switch is electrically coupled between a first terminal of a load and a first terminal for a power source. The second switch is electrically coupled between a second terminal of the load and a second terminal for a power source. The control circuitry is configured to perform operations including connecting the load to the first and second power source terminals by controlling the first and second switches to close during a first portion of a switching cycle, disconnecting the load from the first and second power source terminals by controlling the first and second switches to open during a second portion of the switching cycle, and detecting the capacitance of the load based on the output signal of the capacitive sensing circuit during the second portion of the switching cycle.

20 Claims, 8 Drawing Sheets

(56) References Cited

U.S. PATENT DOCUMENTS

| | | |
|---|---|---|
| 5,461,924 A | 10/1995 | Calderara |
| 5,680,160 A | 10/1997 | LaPointe |
| 5,717,289 A | 2/1998 | Tanaka |
| 6,501,218 B1 | 12/2002 | Duggal |
| 6,604,834 B2 | 8/2003 | Kalana |
| 7,124,220 B2 | 10/2006 | James |
| 7,719,007 B2 | 5/2010 | Tompkins |
| 7,737,633 B2 | 6/2010 | Zheng |
| 7,878,675 B2 | 2/2011 | Finn |
| 7,893,714 B2 | 2/2011 | Chu |
| 8,638,314 B2 | 1/2014 | Sleeman |
| 2002/0186208 A1 | 12/2002 | Feldman |
| 2010/0001965 A1 | 1/2010 | Wang |
| 2010/0097346 A1* | 4/2010 | Sleeman ............... G06F 3/0412 345/174 |
| 2012/0319488 A1* | 12/2012 | Yu ............................ G06F 1/32 307/66 |
| 2014/0001885 A1* | 1/2014 | Xiao ................... H03K 17/962 307/116 |
| 2014/0132154 A1 | 5/2014 | Fried |
| 2014/0253032 A1* | 9/2014 | Bruwer .................. H02M 1/36 320/108 |
| 2015/0115815 A1* | 4/2015 | Huang ............... H05B 33/0818 315/191 |
| 2017/0123540 A1 | 5/2017 | Shih |

\* cited by examiner

Drive Period

Sense Period

CAPACITIVE SENSING PATENT

CROSS-REFERENCE TO RELATED APPLICATION

This application claims the benefit of the filing date of U.S. Provisional Application No. 62/341,593, filed on May 25, 2016. The contents of U.S. Application No. 62/341,593 are incorporated herein by reference in their entirety.

BACKGROUND

Capacitive sensing is used to detect touch inputs on devices such as touch sensitive pads and touch screen displays. User contact with a touch sensor or display screen causes a change in capacitance of the sensor or screen which can be measured to detect the contact. Some display elements (e.g., electro-luminescent (EL) materials) require relatively high drive voltages which may damage conventional capacitive sensors. Furthermore, some capacitive sensing techniques require the use of separate electrodes for providing capacitive touch sensing from the circuits used to provide display illumination.

SUMMARY

In one broad aspect the invention features a capacitive sensing device. The device includes, a first switch, a second switch, a capacitive sensing circuit, and control circuitry. The first switch is electrically coupled between a first terminal of a load and a first terminal for a power source. The second switch is electrically coupled between a second terminal of the load and a second terminal for a power source. The capacitive sensing circuit is electrically coupled to the first terminal of the load. The capacitive sensing circuit is configured to provide an output signal that indicates a capacitance of the load. The capacitive sensing circuit includes an isolation circuit configured to protect the capacitive sensing circuit from a high voltage of the power source. The control circuitry is configured to perform operations that include: connecting the load to the first and second power source terminals by controlling the first and second switches to close during a first portion of a switching cycle, disconnecting the load from the first and second power source terminals by controlling the first and second switches to open during a second portion of the switching cycle, and detecting the capacitance of the load based on the output signal of the capacitive sensing circuit during the second portion of the switching cycle.

A second general aspect can be embodied in a capacitive sensing device that includes a first switch, a second switch, a capacitive sensing circuit, and control circuitry. The first switch is electrically coupled between a first terminal of a load and a first terminal of a power source. The second switch is electrically coupled between a second terminal of the load and a second terminal of a power source. The capacitive sensing circuit is electrically coupled to the first terminal of the load. The capacitive sensing circuit is configured to provide an output signal that indicates a capacitance of the load. The capacitive sensing circuit includes an isolation circuit, a sensor drive signal generator, an alternating current (AC) rectifying circuit, a (resistor-capacitor) RC circuit and a reset circuit. The isolation circuit is configured to protect the capacitive sensing circuit from a high voltage of the power source. The sensor drive signal generator is electrically coupled to the load through a first terminal of the isolation circuit. The AC rectifying circuit is coupled to the load through a second terminal of the isolation circuit. The RC circuit is coupled to the AC rectifying circuit, wherein the output signal that indicates a capacitance of the load is provided as an output from the RC circuit. The reset circuit is coupled to the RC circuit. The control circuitry is configured to perform operations that include: connecting the load to the power source by controlling the first and second switches to close during a first portion of a switching cycle; disconnecting the load from the power source by controlling the first and second switches to open during a second portion of the switching cycle, thereby, permitting the load to be at floating voltage; resetting the capacitive sensing circuit by providing a reset signal to the reset circuit of the capacitive sensing circuit during the second portion of the switching cycle, and detecting the capacitance of the load based on the output signal of the capacitive sensing circuit during the second portion of the switching cycle.

These and other implementations can each optionally include one or more of the following features. In some implementations, a load driving signal provided by the power source has a voltage that exceeds a voltage tolerance of the capacitive sensing circuit.

In some implementations, the load is an electro luminescent (EL) device.

Some implementations include a voltage reduction circuit coupled between the power source and the control circuitry, and wherein the control circuitry is configured to sense a load driving signal supplied by the power source and synchronize the switching cycle with the load driving signal.

In some implementations, the operations of the control circuitry include altering an operation of the load based on the capacitance of the load.

In some implementations, a value of the capacitance indicates a touch input to the load.

In some implementations, the switching cycle is synchronized with a frequency of a load driving signal supplied by the power source.

In some implementations, the switching cycle is between 50 Hz and 150 Hz.

In some implementations, a load driving signal supplied by the power source is between 60 Hz and 3 kHz.

In some implementations, the capacitive sensing circuit includes a sensor drive signal generator, and a peak detection circuit configured to convert a sensor drive signal supplied by the sensor drive signal generator into a direct current (DC) output signal that represents the capacitance of the load.

In some implementations, the isolation circuit is configured to isolate the sensor drive signal generator and the peak detection circuit from a load driving signal supplied by the power source and to permit the sensor driving signal to pass to the load.

In some implementations, the sensor drive signal has a frequency that is greater than a frequency of the load driving signal supplied by the power source.

In some implementations, the isolation circuit is a high pass filter.

In some implementations, the operations of the control circuitry include resetting the capacitive sensing circuit during the second portion of the switching cycle.

In some implementations, the sensor drive signal generator is an output of the control circuitry.

In some implementations, a load driving signal provided by the power source has a voltage that exceeds a voltage tolerance of the capacitive sensing circuit.

In some implementations, the load is an electro luminescent (EL) device.

In some implementations, the load is an organic light-emitting diode (OLED) device.

In another general aspect, the subject matter described in this specification can be embodied a process for making a capacitive sensing device that include actions of electrically coupling a first switch between a first terminal of a load and a first terminal for a power source. Electrically coupling a second switch between a second terminal of the load and a second terminal for a power source. Electrically coupling a capacitive sensing circuit to the first terminal of the load, the capacitive sensing circuit configured to provide an output signal that indicates a capacitance of the load, and the capacitive sensing circuit includes an isolation circuit configured to protect the capacitive sensing circuit from a high voltage of the power source. Electrically coupling control circuitry to the first switch, second switch, and capacitive sensing circuit. Where the control circuitry is configured to perform operations that include: connecting the load to the power source by controlling the first and second switches to close during a first portion of a switching cycle, disconnecting the load from the power source by controlling the first and second switches to open during a second portion of the switching cycle, thereby, permitting the load to be at floating voltage, resetting the capacitive sensing circuit during the second portion of the switching cycle, and detecting the capacitance of the load based on the output signal of the capacitive sensing circuit during the second portion of the switching cycle.

Particular implementations of the subject matter described in this specification can be implemented so as to realize one or more of the following advantages. Implementations provide a drive voltage tolerate capacitive sensing device capable of operating with high voltage loads. Implementations provide a capacitive sensing and load driving device that integrates capacitive touch sensing into existing electrical components (e.g., wire traces) of an electrical load, thus alleviating the requirement for separate touch sensing and load driving circuits in conventional systems. Implementations may provide the ability to add capacitive touch sensing to many different types of electrical loads. For example, implementations may provide the ability to detect touch inputs on a portion of many different types of electrically powered devices. Implementations may add capacitive sensing to electrical devices by converting the same circuit traces that are used to drive an electrical load into capacitive touch sensors.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Implementations of the present disclosure are directed to a capacitive sensing device. The capacitive sensing device includes a load driving circuit that functions in parallel with a capacitive sensing circuit. In other words, the capacitive sensing device can operate to perform both the functions of driving an electrical load and sensing touch input on the load using capacitive touch sensing. Moreover, in some implementations, the capacitive sensing device can drive and perform capacitive touch sensing on high voltage load including, but not limited to, organic light-emitting diode (OLED) loads that may require voltages of 30 V or greater and electro-luminescent (EL) loads that may require driving voltages ranging between 50-800 V; 50-600 V; or 50-400V.

Figure 1A:
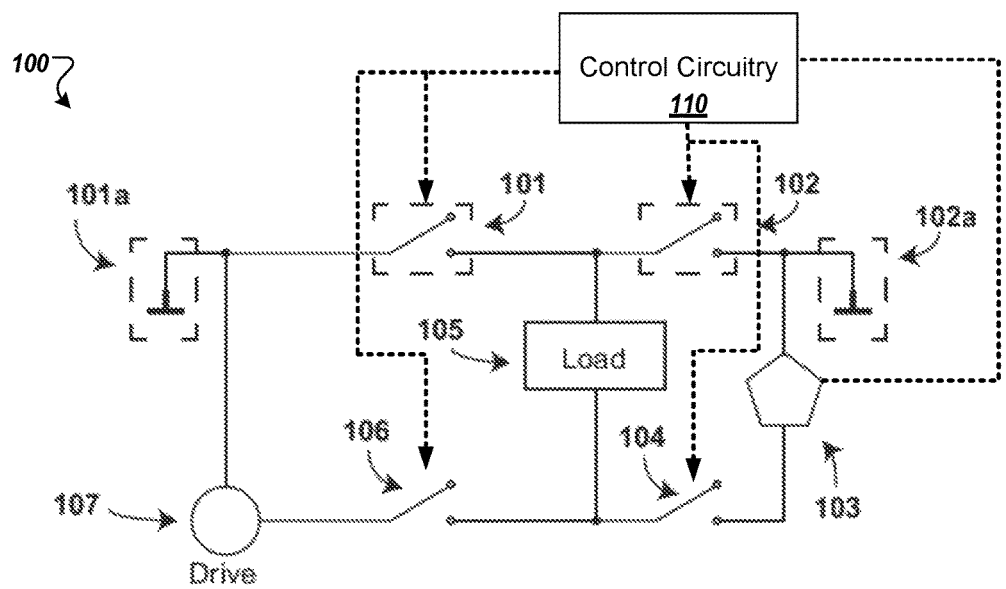
FIGS. 1A-1C are schematic diagrams of an example implementation of a capacitive sensing device.
Figure 1B:
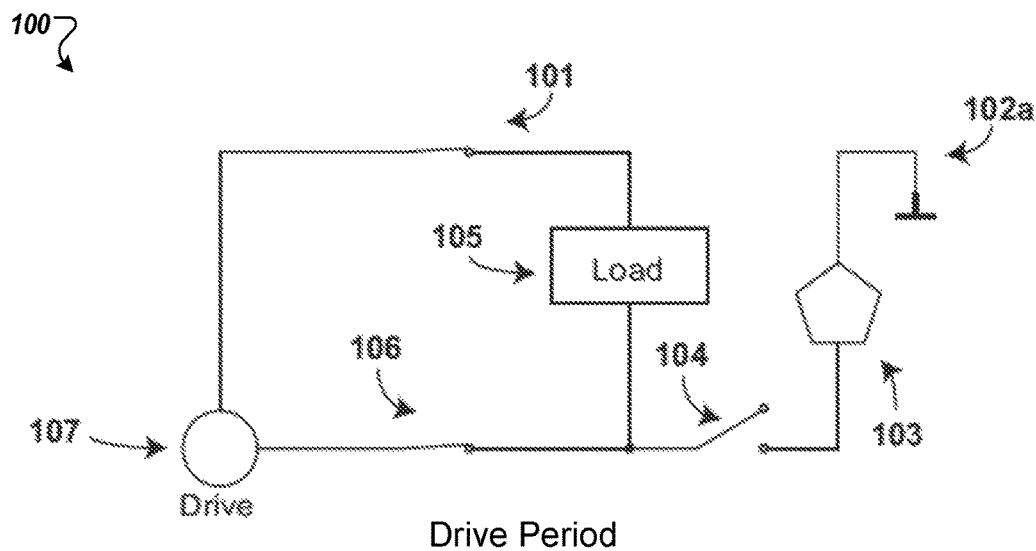
Figure 1C:
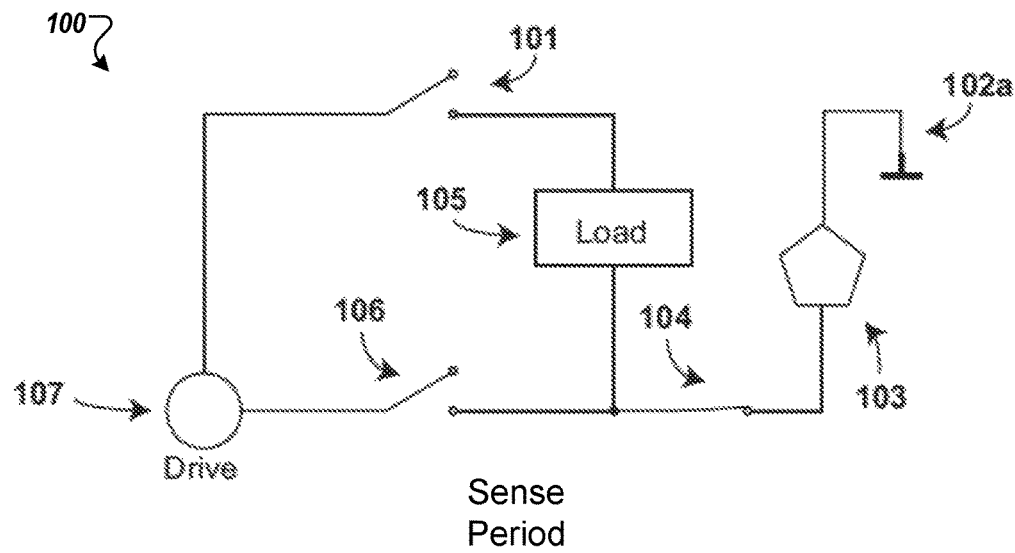

FIGS. 1A-1C are schematic diagrams of an example implementation of a capacitive sensing device 100. Capacitive sensing device 100 includes a capacitive sensing circuit 103, an electrical load 105, a load driving power source 107, a first pair of switches 101 and 106, a second pair of switches 102 and 104, and control circuitry 110. Each of the first pair of switches 102 and 104 are connected between the power source 107 and the load 105. The first pair of switches 101 and 106 serve to isolate the load from the power source during one portion of a load driving/sensing cycle. The second pair of switches 102 and 104 are connected between the capacitive sensing circuit 103 and the power source 107. The second pair of switches 102 and 104 serve to isolate the capacitive sensing circuit 103 from the power source 107 during a portion of the load driving/sensing cycle and connect the capacitive sensing circuit 103 to the load 105 during another portion of the load driving/sensing cycle. The control circuitry 110 is coupled to control terminals of the switches 101, 102, 104, and 106 and controls the operation of the switches. The control circuitry 110 coupled to the capacitive sensing circuit 103 and receives capacitive sense signals from the capacitive sensing circuit 103. In some implementations, as discussed in more detail below, the control circuitry 110 can control operations of the capacitive sensing circuit 103.

The power source 107 can be an AC or DC power source, depending on the requirements of the electrical load 105. The power source 107 can include circuitry to condition the power to meet requirements of the electrical load 105. For example, the power source 107 can include AC/DC or DC/AC converters (e.g., rectifier circuits or inverter circuits), voltage regulators, voltage reduction circuits (e.g., voltage divider circuits), or transformers to decrease or increase a voltage of the power source 107. In some implementations, the power source 107 is integrated with the capacitive sensing device 100, for example, as a battery. In some implementations, the power source 107 is an external power source, for example, a connection to an AC power outlet.

The switches 101, 102, 104, and 106 can each be solid state switches (e.g., transistors). In some implementations, the switches 101, 102, 104, and 106 are transistors or high voltage (HV) analog switches that have a high off-state impedance (e.g., up to −60 dB off-state signal isolation) and a low parasitic capacitance. In some implementations, the switches 101, 102, 104, and 106 are transistors or HV analog switches that have a high switching speed (e.g., 20 MHz switching frequency). In some implementations, one or more of the switches 101, 102, 104, and 106 can be replaced by high impedance components such as a resistor, a diode, or open circuit (e.g., as shown by the replacement of switch 102 with an open circuit in FIGS. 1B and 1C).

As discussed in more detail below in reference to FIGS. 3-6, the capacitance sensing circuit 103 is configured to generate an output signal that indicates the capacitance of the load 105. The capacitance sensing circuit 103 can be configured to measure the self-capacitance of the load or the mutual capacitance of a load. For example, self-capacitance of a load is the capacitance between a particular portion of the load (e.g., a terminal or a wire trace and a ground directly). Generally, a user alters the self-capacitance of the load by contacting the load or, in some examples, coming within a sufficiently close proximity to the load. For example, the distance from a load at which capacitance changes can be detected may range from zero to twelve inches or greater depending on the physical dimensions of the load and/or sensitivity of the capacitive sensing circuit 103. The user's contact or proximate relationship to the load capacitively couples the load to a reference ground, thereby, altering the self-capacitance measured by the capacitive sensing circuit 103. The measured capacitance of the load 105 depends on a user contact with or proximity to the load. Mutual-capacitance of a load is the capacitance between two different portions of the load, e.g., two different terminals or wire traces. Generally, a user's contact with the load deforms one of the portions of the load, alters the amount of charge on one portion, or provides an electrical shunt between the two portions, thereby, altering the measured capacitance between the two portions of the load. The capacitive sensing circuit103 can be configured to sense either self-capacitance or mutual capacitance, as explained in more detail below.

In some implementations, the capacitive sensing circuit103 is not configured to tolerate voltages of drive signals produced by the power source 107. Thus, switches 102/104 may be used to provide protection for the capacitive sensing circuit103 in such implementations, by disconnecting the capacitive sensing circuit103 from the power source 107 during drive periods. In some implementations, as discussed below in reference to FIGS. 2A-3, the capacitive sensing circuit103 is configured to tolerate high voltages produced by the power source 107. Thus, in such implementations, switches 102/104 may not be necessary.

The control circuitry 110 be implemented as a processor or microcontroller with software instructions to control the operations of the capacitance sensing device 100. In some implementation, the control circuitry 110 can be implemented as a special purpose integrated circuit, for example, an application specific integrated circuits (ASIC), or a field programmable logic arrays (FPGA). The control circuitry 110 can be configured to perform the control operations of the capacitive sensing device 100 described below. For example, the control circuitry 110 can be programed to perform the operations described below.

In operation, the control circuitry 110 controls the operation of each pair of switches 101/106 and 102/104 to operate in combination during a switching cycle (e.g., "load drive/ sense cycle"). For example, during a first portion (e.g., a "drive period" as shown in FIG. 1B) of the load drive/sense cycle, switches 101 and 106 are closed (transistors turned on) to provide a drive signal from the power source 107 to the load 105. The control circuitry110 opens switches 102/ 104 (transistors turned off) during the drive period to disconnect the capacitive sensing circuit103 from circuit, thereby, protecting it from potentially high voltages of the power supply 107.

During a second portion (e.g., a "sense period" as shown in FIG. 1C), the control circuitry110 opens switches 101/106 to disconnect the load 105 from the power source 107, and closes switches 102/104 to permit the capacitive sensing circuit103 to measure the capacitance of the load 105. During the sense period, the control circuitry110 receives an output signal from the capacitive sensing circuit103 that indicates the measured capacitance of the load 105. For example, the output signal can be a DC voltage level that indicates a relative capacitance of the load 105. The control circuitry110 can determine whether a user is touching the load 105 based on the measured capacitance of the load 105. For example, the control circuitry110 can compare the received output signal to a pre-determined threshold value to detect a user's touch. For example, the threshold value may be a calibrated value that indicates a value (value range) of the output signal when a user (or other object) is not in contact with the load 105. The control circuitry110 can then detect a user's touch input if the output of the capacitive sensing circuit103 deviates (e.g., is greater or less than) the threshold value.

The control circuitry110 performs the load drive/sense cycle at a frequency sufficiently high enough to avoid or minimize any interruptions in the operation of the load 105. For example, if the load is a light emitting device (e.g., an EL device, OLED, or LED) the load drive/sense cycle should be performed at a sufficiently high frequency that any flicker in the light emitting device is imperceptible to a user, but at a low enough frequency that permits the light emitting device to fully illuminate during the drive period. For example, the load drive/sense cycle can be between 60 Hz and 90 Hz. In other implementations, the load drive/sense cycle can be faster or slower than 60 Hz and 90 Hz (e.g. 50-150 Hz). In addition, the drive period and the sense period need not be equal portions of the load drive/sense cycle. For example, the sense period can be a shorter portion of the load drive/sense cycle period than the drive period. The sense period can be a sufficient amount of time to conduct a capacitance measurement. For example, with a load drive/sense cycle between 60 and 90 Hz, the sense period can be 20-30% of the load drive/sense cycle period.

In some implementations, the control circuitry 110 can be configured to alter the operation of the load in response to detecting the touch input. For example, the control circuitry110 can be configured to turn the load 105 on or off based on a touch input. As another example, the control circuitry 110 can be configured to adjust a brightness of the load. The control circuitry110 can be configured to control the power source 107 and can shut down the power or alter the magnitude of the power supplied in response to detecting a touch input. In some implementations, the control circuitry110 may stop the operation of the switches (e.g., stop the switching cycle) when the load is turned off to save power.

In some implementations, during the sense period, the control circuitry110 can control the operations of the capacitive sensing circuit103. For example, the control circuitry110 can reset the capacitive sensing circuit103 prior to obtaining a capacitance measurement. The control circuitry110 can provide a driving signal to the capacitive sensing circuit103 for performing the capacitance measurement. For example, the control circuitry110 can provide a high frequency drive signal (e.g., 10 kHz-500 kHz). In some implementations, the capacitive sensing circuit103 drive signal can be about 200 kHz (e.g., 187.5 kHz).

In some implementations, the capacitive sensing device 100 can be configured to measure self-capacitance of the load 105 by arranging the switches and any circuit grounds 101a and 102a so that the load is left at a floating voltage (e.g., disconnected from ground) during the sense period. Thus, the capacitance of the load is altered when a user or an object comes in contact with the load 105 so as to provide a path to ground. In some implementations, permitting the load to float during the sense period may provide for more sensitive measurements of the load's capacitance 105.

In some implementations, the capacitive sensing device 100 can be configured to measure mutual capacitance of the load 105. For example, in such implementations, the capacitive sensing device 100 can include all of the switches 101, 102, 104, and 106, but may not include either ground connection 101a or 102a.

In some implementations, if the drive signal supplied by the power supply 107 is DC the capacitive sensing device 100 can be configured to measure self-capacitance of the load 105. For example, in such implementations, the capacitive sensing device 100 can include a ground connection 102a to the capacitive sensing circuit103 and switch 101 may be replaced with an open circuit (e.g., as shown in FIGS. 1B and 1C).

Figure 2A:
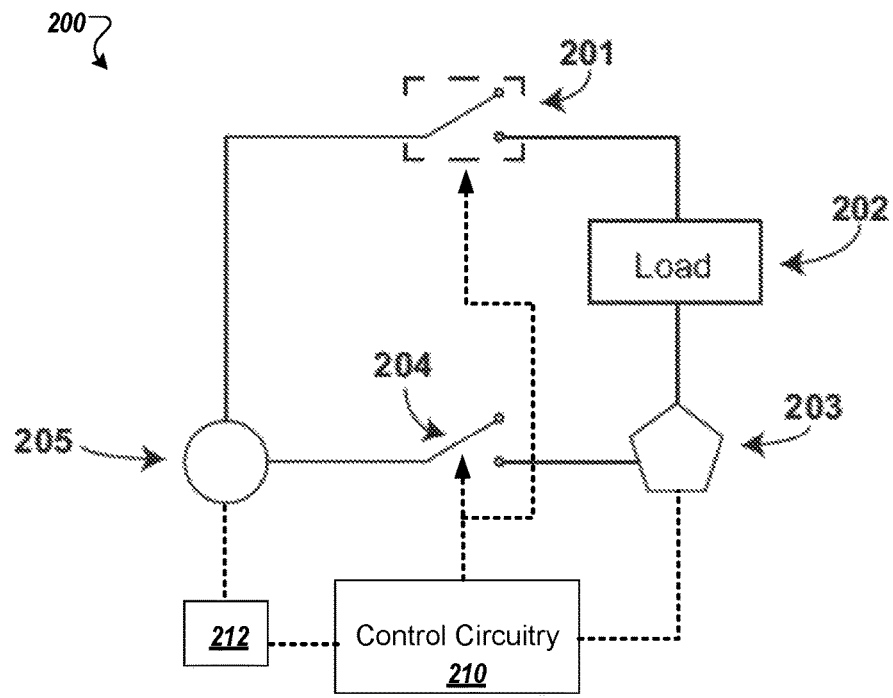
FIGS. 2A-2C are schematic diagrams of another example implementation of a capacitive sensing device.
Figure 2A:
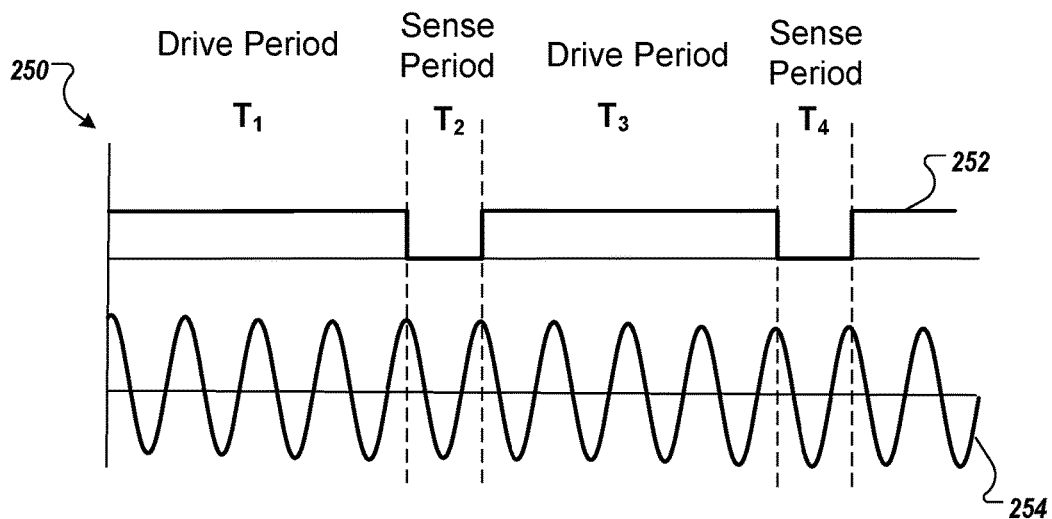
Figure 2B:
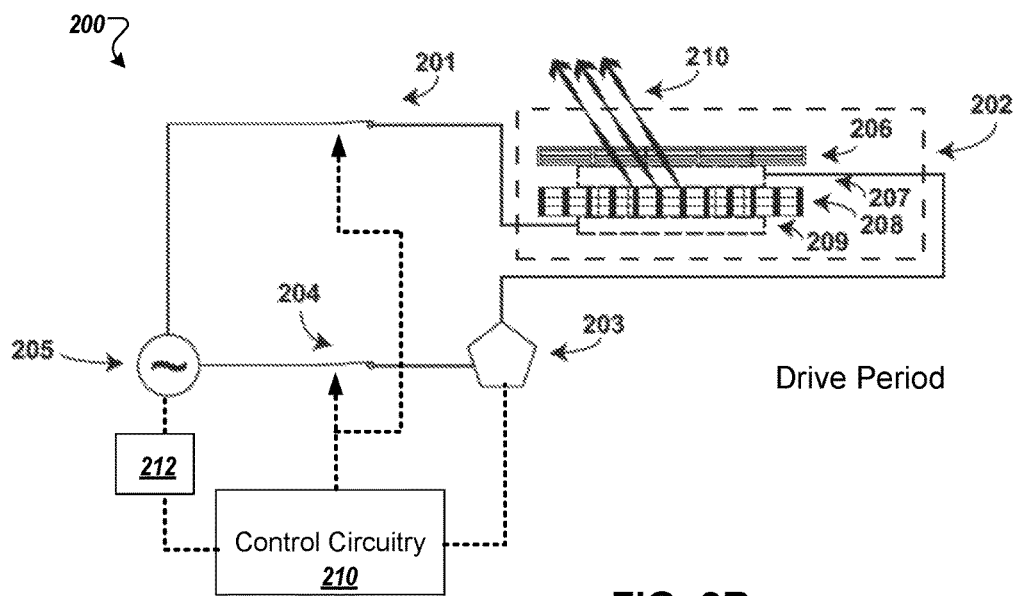
Figure 2C:
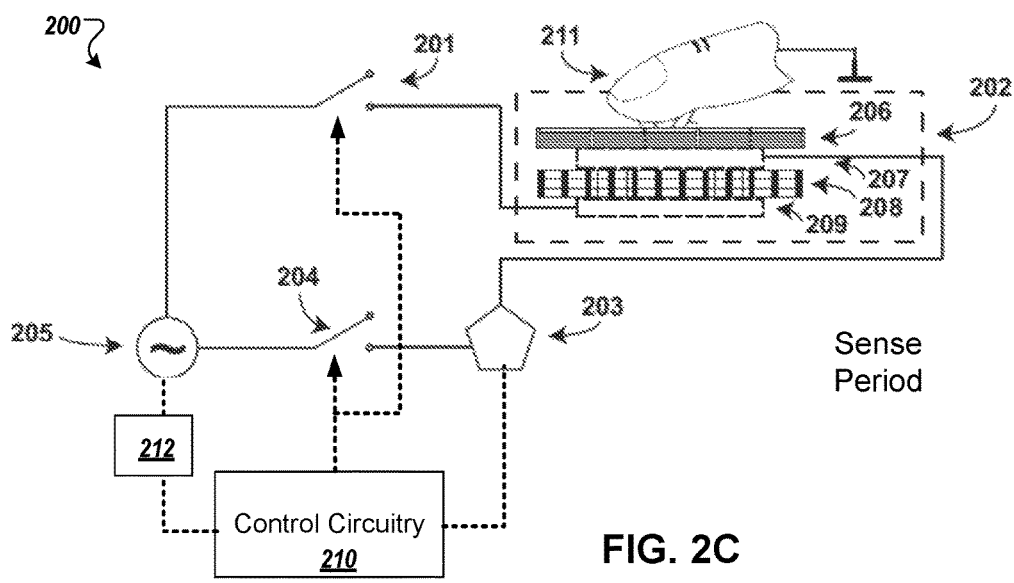

FIGS. 2A-2C are schematic diagrams of another example implementation of a capacitive sensing device 200. Capacitive sensing device 200 is an example of a capacitive sensing device that with a high voltage tolerant capacitive sensing circuit203. Because the capacitive sensing circuit203 is high voltage tolerant the switches 102/104 of capacitive sensing device 100 are not required in capacitive sensing device 200. Furthermore, the capacitive sensing device 200 is configured to measure the self-capacitance of one of the leads or terminals of the load 202, by leaving the load 202 at a floating voltage during the sense period of the load drive/sense cycle.

Capacitive sensing device 200 includes a capacitive sensing circuit 203, an electrical load 202, a load driving power source 205, a pair of switches 201 and 204, control circuitry 210, and, optionally, voltage reduction circuitry 212. The pair of switches 201 and 204 are connected between the power source 205 and the load 202, and serve to isolate the load from the power source during one portion of the load driving/sensing cycle (shown in timing diagram 250). The control circuitry 210 is coupled to control terminals of the switches 201 and 204 and controls the operation of the switches. The control circuitry 210 is coupled to the capacitive sensing circuit 203 and receives capacitive sense signals from the capacitive sensing circuit 203. In some implementations, as discussed in more detail below, the control circuitry 210 can control operations of the capacitive sensing circuit 203.

The power source 205 can be an AC or DC power source, depending on the requirements of the electrical load 105. The power source 205 can include circuitry to condition the power to meet requirements of the electrical load 105. For example, the power source 205 can include AC/DC or DC/AC converters (e.g., rectifier circuits or inverter circuits), voltage regulators, voltage reduction circuits (e.g., voltage divider circuits), or transformers to decrease or increase a voltage of the power source 205. In some implementations, the power source 205 is integrated with the capacitive sensing device 200, for example, as a battery. In some implementations, the power source 205 is an external power source, for example, a connection to an AC power outlet.

The switches 201 and 204 can each be solid state switches (e.g., transistors). In some implementations, the switches 201 and 204 are transistors or HV analog switches that have a high off-state impedance (e.g., up to −60 dB off-state signal isolation) and a low parasitic capacitance. In some implementations, the switches 201 and 204 are transistors or HV analog switches that have a high switching speed (e.g., 20 MHz switching frequency).

As discussed in more detail below in reference to FIGS. 3-6, the capacitance sensing circuit 203 is configured to generate an output signal that indicates the capacitance of the load 202. The capacitance sensing circuit 203 can be configured to measure the self-capacitance of the load or the mutual capacitance of a load. As illustrated in FIGS. 2A-2C, the capacitance sensing circuit 203 is configured to sense the self-capacitance of load 202.

The control circuitry 210 can be implemented as a processor or microcontroller with software instructions to control the operations of the capacitance sensing device 200. In some implementations, the control circuitry 210 can be implemented as a special purpose integrated circuit, for example, an application specific integrated circuits (ASIC), or a field programmable logic arrays (FPGA). The control circuitry 210 can be configured to perform the control operations of the capacitive sensing device 200 described below. For example, the control circuitry 210 can be programmed to perform the operations described below.

In addition, FIGS. 2B and 2C illustrate the capacitive sensing device 200 connected to an example EL load 202. The EL load 202 includes a protective (e.g., insulating) layer 206, an upper electrode 207, an electro-luminescent material layer 208 (e.g., a light emitting phosphor), and a lower electrode 209. In the case of EL paint, layer 207 can be a transparent conductor layer which is applied on top of the luminescent layer 208. Layer 206 can be a layer or set of layers which act to protect the electrical layers and to change/filter the color of the emitted light.

In operation, the control circuitry 210 controls the operation of the pair of switches 201/204 to operate in combination during a switching cycle (e.g., "load drive/sense cycle"). Timing diagram 250 in FIG. 2A and FIGS. 2B and 2C illustrate the operations of capacitive sensing device 200 during an example switching cycle. Timing diagram 250 illustrates an example switch control signal 252 provided by the control circuitry 210 and an example load drive signal 254 provided by the power source 205. It should be noted that the frequencies of each signal as illustrated are exemplary, and, in practice, the frequency of the load drive signal 254 may be thirty to fifty times greater than that of the switching cycle.

For example, during a first portion of the load drive/sense cycle (e.g., a "drive period" as shown in timing diagram 250 and FIG. 2B), control circuitry 210 closes switches 201 and 204 (transistors turned on) to provide a drive signal from the power source 205 to the load 202. During a second portion of the load drive/sense cycle (e.g., a "sense period" as shown in timing diagram 250 and FIG. 2C), the control circuitry 210 opens switches 201 and 204 to disconnect the load 202 from the power source 205. During the sense period, the control circuitry 210 receives an output signal from the capacitance sensing circuit 203 that indicates the measured capacitance of the load 202. For example, the output signal can be a DC voltage level that is indicates a relative capacitance of the load 202. The control circuitry 210 can determine whether a user is touching the load 202 based on the measured capacitance of the load 202. For example, the control circuitry 210 can compare the received output signal to a pre-determined threshold value to detect a user's touch. For example, the threshold value may be a calibrated value that indicates a value (value range) of the output signal when a user (or other object) is not in contact with the load 202. The control circuitry 210 can then detect a user's touch input if the output of the capacitance sensing circuit 203 deviates (e.g., is greater or less than) the threshold value.

The control circuitry 210 performs the load drive/sense cycle at a frequency sufficiently high enough to avoid or minimize any interruptions in the operation of the load 105. For example, if the load is a light emitting device (e.g., an EL device, OLED, or LED) the load drive/sense cycle should be performed at a sufficiently high frequency that any flicker in the light emitting device is imperceptible to a user, but at a low enough frequency that permits the light emitting device to fully illuminate during the drive period. For example, the load drive/sense cycle can be between 60 Hz and 90 Hz. In other implementations, the load drive/sense cycle can be faster or slower than 60 Hz and 90 Hz. In addition, the drive period and the sense period need not be equal portions of the load drive/sense cycle. For example, the sense period can be a shorter portion of the load drive/sense cycle period than the drive period. The sense period can be a sufficient amount of time to conduct a capacitance measurement. For example, with a load drive/sense cycle between 60 and 90 Hz, the sense period can be 20-30% of the load drive/sense cycle period.

In some implementations, the control circuitry 210 synchronizes the load drive/sense cycle with the load drive signal from the power source 205. For example, the control circuitry 210 can be coupled to an output of the power source through a voltage reduction circuit 212. Voltage reduction circuit provides a reduced voltage sample of the load drive signal to the control circuitry 210. The control circuitry 210 can coordinate the operation of the switches 201 and 204 to be synchronized with a phase of the load drive signal 254, as illustrated by the vertical dashed lines in the timing diagram 250. In some implementations, the frequency of the load drive/sense cycle may be a sub-harmonic of the load drive signal 254. For example, the period of the load drive/sense cycle may be an integer multiple of the period of the load drive signal 254, or approximately and integer multiple (e.g., within reasonable engineering tolerances). In some implementations, the control circuitry 210 can synchronize the load drive/sense cycle with the load drive signal 254 by maintaining the load drive/sense cycle in phase with the load drive signal 254.

In some implementations, the control circuitry 210 can be configured to alter the operation of the load in response to detecting the touch input. For example, the control circuitry 210 can be configured to turn the load 202 on or off based on a touch input. The control circuitry 210 can be configured to control the power source 205 and can shut down the power or alter the magnitude of the power supplied in response to detecting a touch input. In some implementations, the control circuitry 210 may stop the operation of the switches (e.g., stop the switching cycle) when the load is turned off to save power. In some implementations, the control circuitry 210 can stop the operation of the power supply while continuing to perform sensing measurements in order to save power in a "sleep" mode.

In some implementations, during the sense period, the control circuitry 210 can control the operations of the capacitance sensing circuit 203. For example, the control circuitry 210 can reset the capacitance sensing circuit 203 prior to obtaining a capacitance measurement. The control circuitry 210 can provide a driving signal to the capacitance sensing circuit 203 for performing the capacitance measurement. For example, the control circuitry 210 can provide a high frequency drive signal (e.g., 10 kHz-500 kHz). In some implementations, the capacitance sensing circuit 203 drive signal can be 200 kHz.

As illustrated, the capacitive sensing device 200 is configured to measure self-capacitance of the load 202. During the sense period, the load 202 is decoupled from a reference voltage (e.g., ground) and left at a floating voltage. For example, during the sense period, the control circuitry 210 decouples the load 202 from ground by opening switches 201 and 204. In some implementations, permitting the load to float during the sense period may provide for more sensitive measurements of the load's capacitance. Decoupling the load 202 from ground may provide increased sensitivity by improving the difference between the self-capacitance measurements of load 202 with respect to the environment and self-capacitance measurements of load 202 with respect to a reference ground at the device 200 (e.g., reference ground 305). The self-capacitance of load 202 with respect to the environment can be altered by configurational changes. For example, the capacitance of the load 202 is altered when a user (e.g., user finger 211) or an object comes in contact with the load 202 so as to provide a path to ground.

Figure 3:
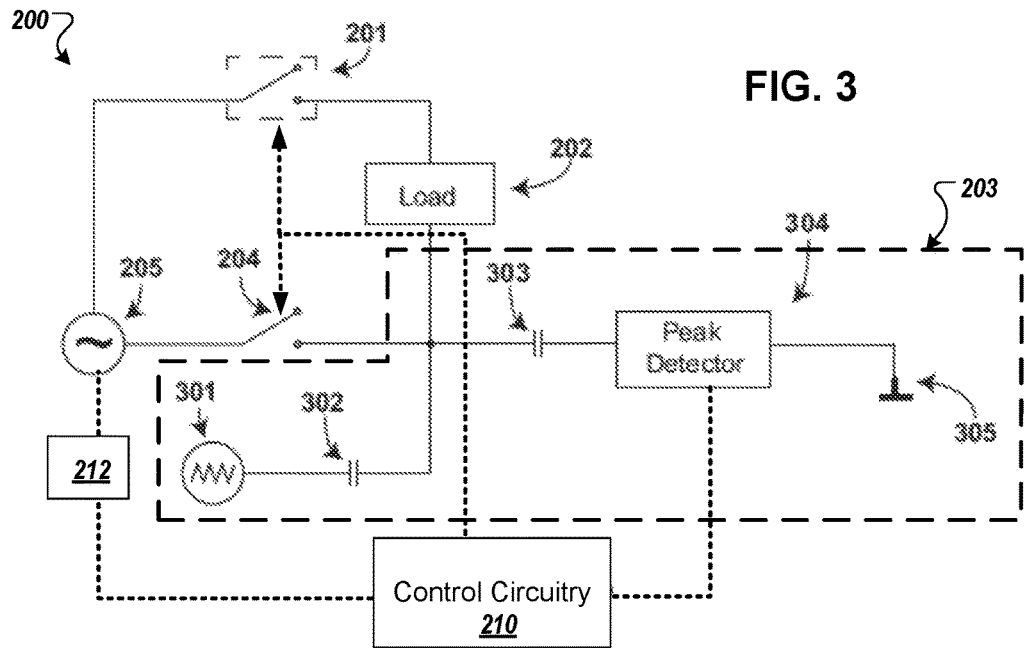
FIG. 3 is a schematic diagram the capacitive sensing device of FIG. 2 that shows additional details of an example capacitive sensing circuit.

FIG. 3 is a schematic diagram capacitive sensing device 200 that shows additional details of an example capacitive sensing circuit 203. The capacitive sensing circuit 203 includes sensor drive signal generation circuitry 301, an isolation circuit (capacitors 302 and 303), and a peak detector 304.

The isolation circuit isolates the sensor drive signal generation circuit 301 and the peak detection circuit 304 from the load driving signal supplied by the power source 205. The isolation circuit permits the sensor driving signal to pass from the sensor drive signal generation circuit 301 to the load 202 and the peak detection circuit 304. In some implementations, the isolation circuit can be a high pass filter. For example, the filter can be configured with a cutoff frequency that passes the high frequency sensor drive signal, but attenuates the load drive signal sufficiently to protect the sensor drive signal generation circuit 301 and the peak detection circuit 304. For example, as illustrated, the isolation circuit is implemented as two capacitors 302 and 303.

The peak detection circuit 304 converts a sensor drive signal supplied by the sensor drive signal generation circuit 301 into a direct current (DC) output signal that represents the capacitance of the load 202. For example, during the sensing period the load 202 is left ungrounded. With no object (e.g., a user finger 211) in contact with the load to ground it, the amplitude of the sensor drive signal at the peak detector 304 will have one value. However, when an object is in contact with the load 202 (or in some cases, not in contact but close enough to alter the self-capacitance of the load) the amplitude of the sensor drive signal at the peak detector 304 will have a different value that corresponds to the change in capacitance of the load 202. The peak detector 304 can include an AC-DC circuit (e.g., a rectifier circuit) to convert the sensor drive signal to a DC value that can be provided as an input to the control circuitry 210.

Figure 7:
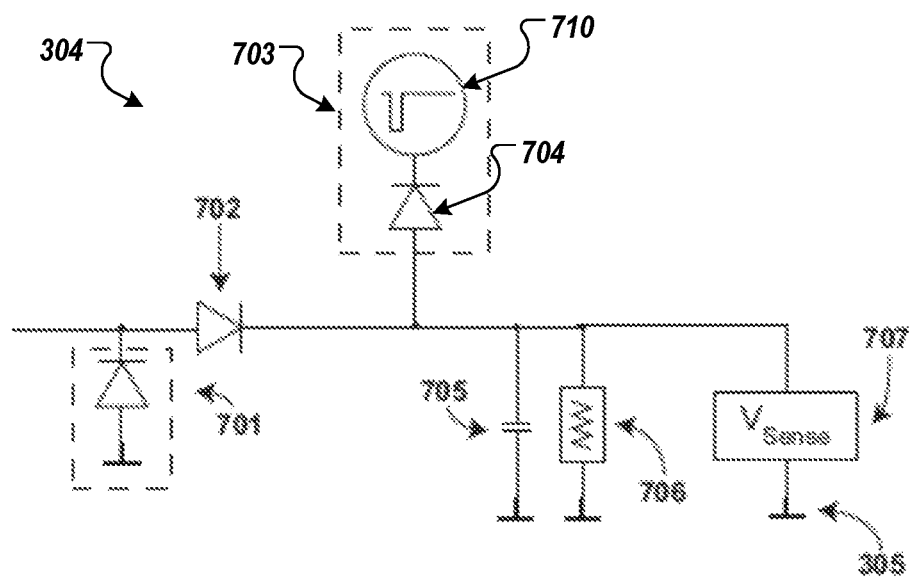
FIG. 7 is a schematic diagram of an example peak detection circuit for a capacitive sensing circuit.

FIG. 7 is a schematic diagram of an example peak detector 304 for a capacitive sensing circuit 203. The peak detector 304 includes an AC/DC conversion circuit (e.g., diode 702), a reset circuit 703, and a smoothing filter (e.g., an RC circuit including capacitor 705 and resistor 706). The AC/DC conversion circuit is coupled to the load through the isolation filter (e.g., capacitor 303 of FIG. 3). The filter (e.g., RC circuit) is coupled to the AC/DC conversion circuit. The DC output signal 707 ("$V_{sense}$") is taken at the output of the smoothing filter and with reference to a ground 305.

The AC/DC conversion circuit can be a half wave rectifier (e.g., as shown by diode 702) or a full wave rectifier (e.g., a bridge rectifier), or another appropriate AC rectifying circuit.

The reset circuit 703 may receive a reset signal 710 from the control circuitry 210 to reset the peak detector 304 by driving the circuit output to ground before conducting a measurement. In the example implementation, the reset circuit 703 includes a reset signal input and a diode 704. As illustrated, the reset circuit 703 can be an "active low" circuit in which the circuit is reset by a low input signal. In some implementations, the reset circuit 703 can include a transistor in addition to or in place of the diode 704 and can be connected to a ground. The control circuitry can control the transistor to reset the peak detector 304 by grounding the circuit.

In some implementations, the peak detector 304 includes a diode 701 connected between the input to the AC/DC conversion circuit (diode 702) and a ground. Diode 701 may improve the sensitivity of the peak detector 304.

The sensor drive signal generation circuitry 301 generates a high frequency (e.g., 10 kHz-100 kHz) sensor drive signal. The sensor drive signal generation circuit 301 can be a signal generator such as an oscillator circuit, a crystal oscillator, a voltage controlled oscillator, or other appropriate signal generator. In some implementations, the sensor drive signal generation circuit 301 is a signal conditioning circuit that conditions a sensor drive signal provided by the control circuitry 210. For example, as illustrated in FIGS. 4-6, the sensor drive signal generation circuit 301 can include filters and other signal conditioning circuitry to generate an appropriate sensor drive signal.

Figure 4:
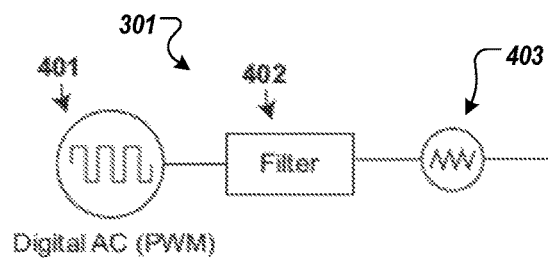
FIGS. 4-6 are a schematic diagrams of example sensor drive signal generation circuits.
Figure 5:
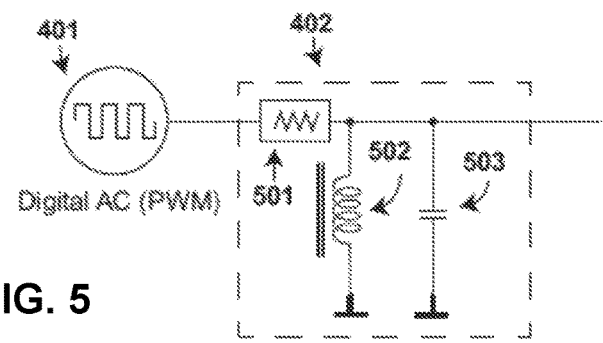
Figure 6:
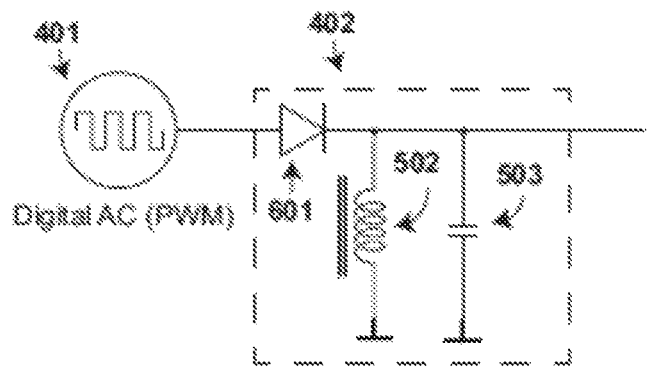

FIGS. 4-6 are a schematic diagrams of example sensor drive signal generation circuits. FIG. 4 illustrates a sensor drive signal generation circuit 301 that includes a low pass filter 402 to generate a sensor drive signal 403 by removing high frequency components of a pulse width modulation (PWM) signal 401 generated by the control circuitry 210. FIG. 5 illustrates the filter 402 implemented as an RLC circuit including a resistor 501 electrically connected to an inductor 502 and capacitor 503. FIG. 6 illustrates an implementation of filter 402 with a diode 601 replacing the resistor 501.

Figure 8A:
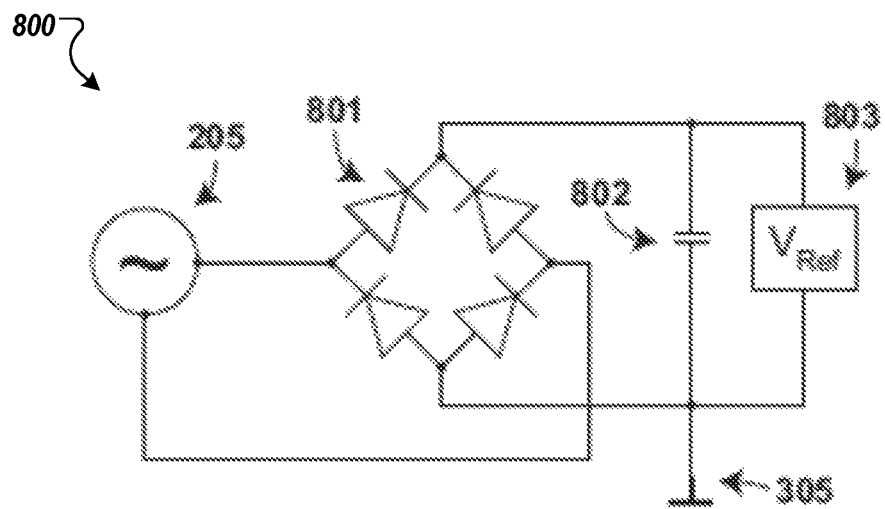
FIG. 8A and 8B are a schematic diagrams of example coupling circuits for an external power source.

FIG. 8A is a schematic diagram of an example coupling circuit 800 for an external power source. Coupling circuit 800 produces a reference signal 803 which couples the AC drive signal from an external power source 205 with the ground 305. It does this by passing the drive signal through a bridge rectifier 801, the output of which is passed to a high voltage capacitor 802 which is coupled to ground 305.

Figure 8B:
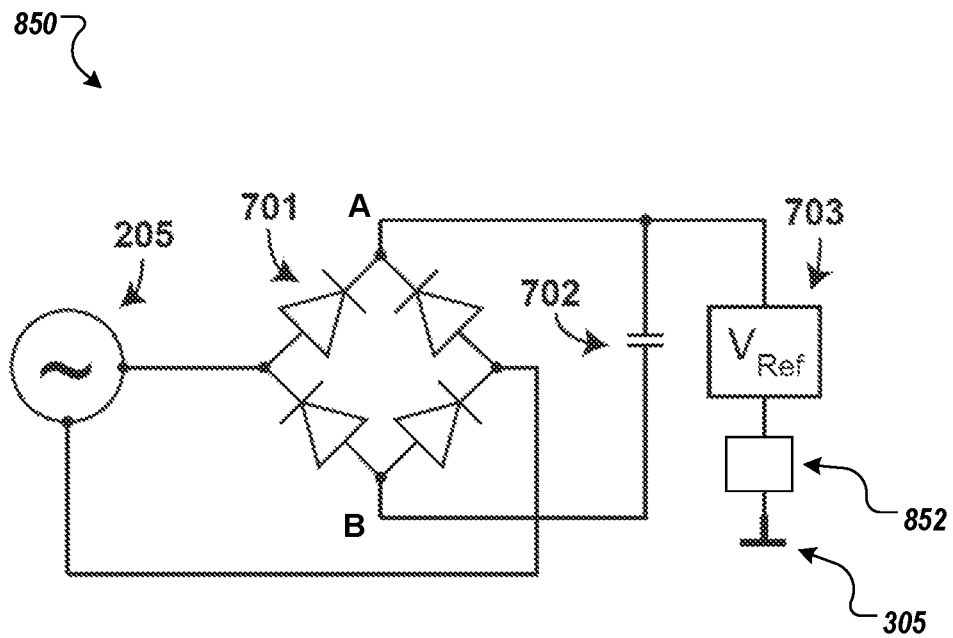

FIG. 8B is a schematic diagram of another example coupling circuit 850 for an external power source. Coupling circuit 850 is similar to circuit 800, however, circuit 850 includes an impedance element 852 connected between ground 305 and the reference signal output 803. The impedance element 852 can be, for example, a high impedance resistor. For example, impedance element 852 can be a resistor with an impedance greater than or equal to 300 k$\Omega$, greater than 500 k$\Omega$, greater than 1 M$\Omega$. In addition, the ground 305 is not connected to the bridge rectifier 801 in circuit 850. Although circuit 850 as illustrated shows the reference signal output 803 as being connected to the output terminal of the diodes in the bridge rectifier 801 (e.g., at node A), in some implementations, the reference signal output 803 is connected to the input terminals of the diodes in the bridge rectifier 801 (e.g., at node B).

In some examples of the implementations described herein switches can be implemented as high voltage (HV) analog switches. Example, HV analog switches include, but are not limited to, IXYS switches such as the CPC7200 series switches, CPC7600 series switches, and CPC7200 series switches and microchip switches such as HV2201 series switches, HV2301 series switches, HV20220 series switches.

In some examples of the implementations described herein load elements can include, but are not limited to, for example, touch sensitive fabrics, pressure sensitive circuits, display circuits, light emitting materials (e.g., luminescent paint, tape, wires, panels), and EL devices and displays.

Figure 9:
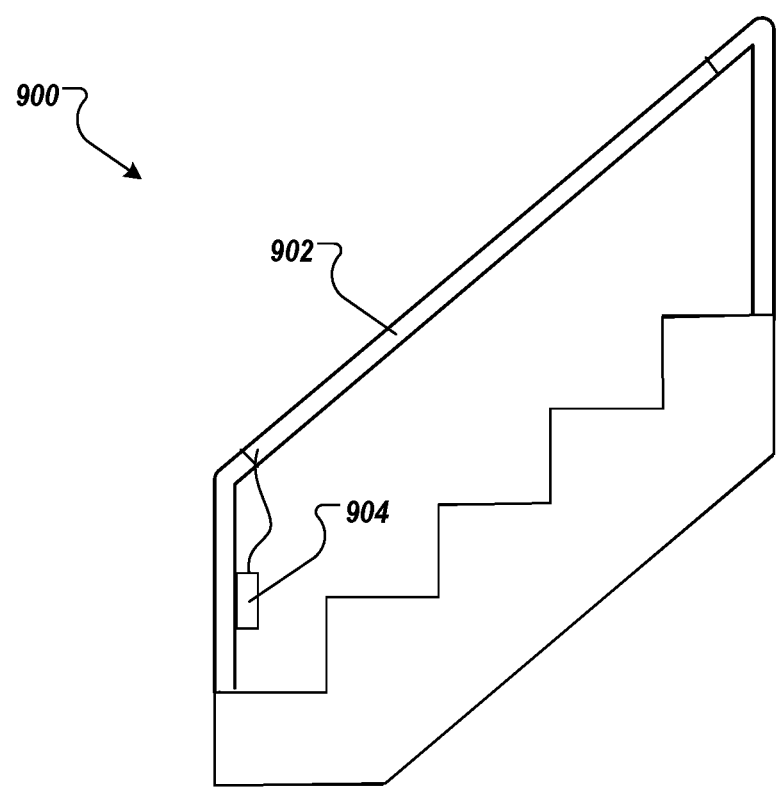
FIG. 9 shows example devices in which capacitive sensing devices according to implementations of the present disclosure can be used.

FIG. 9 shows example devices in which capacitive sensing devices according to implementations of the present disclosure can be used. In some implementations, a capacitive sensing device can be paired with a light emitting load in architectural applications. For example, light emitting loads 902 (e.g., EL lighting materials) can be integrated into support elements like stairway handrails 900. The capacitive sensing device 904 will sense a user's touch on the light emitting layer (e.g., when a user grasps the handrail 900) and in response, illuminate the light emitting layer. In such implementations, the capacitive sensing device 904 may save energy by permitting such safety illumination to remain off until a user is in need of the illumination (e.g., as detected by a user's contact with a light emitting strip 902).

In some implementations, light emitting loads can also be integrated into other interior elements such as furniture or appliances. For example, a bedside table can be integrated with light emitting loads that take on the shape of various functions (like a phone, or a light switch). In such implementations, a capacitive sensing device could detect a user's touch input to initiate a control sequence (e.g., initiating a phone call, or controlling the room lights by turning them off/on or dimming). Such implementations may enable seamless control of interior environments. In the case of appliances, for example, a light emitting load may be integrated with an electric stove and serves as an indicator that a stove top has a burner on. The capacitive sensing device may enable a user to quickly turn off the stove by touching the light emitting load, or a portion of the stove to which the device is connected.

In other implementations, the capacitive sensing device can be used for controlling light emitting loads that are well suited for application in other settings, such as the interiors of automobiles. For example, a light emitting load can be integrated into the ceiling or doors of a car, which can be activated through touch by the capacitive sensing device to illuminate the interior without requiring a dedicated button.

In some implementations, the capacitive sensing device can be used to control light emitting loads for wearable applications. For example, light emitting loads can be incorporated into garments for application in safety and aesthetics. When a garment is worn, the body shifts within it. These shifts can be measured by a capacitive sensing device to make light emitting loads respond to motion within a garment. Further, by incorporating ground planes within the garment, a capacitive sensing device can be configured to distinguish between interactions by a wearer from the ones external to the garment. For example, a bicycle jacket with light emitting loads integrated into the shoulders can be triggered (as turn signals), with the shrug of a shoulder (or similar interaction). Another related example is a helmet with an integrated light emitting load which can be activated at night through touch.

In some implementations, the capacitive sensing device can be coupled with a series of light emitting loads to provide a platform for designing interaction into smart fabrics. For example, a piece of carpeting with integrated light emitting loads can be used to highlight the edges of the covering for the purposes of safety which can be turned on or off by touching particular areas of the carpet.

In some implementations, a capacitive sensing device can be used with toys and/or therapeutic devices. For example, interactive light can be used as a therapeutic tool for rehabilitating patients after strokes. An example of such an implementation can include a series of different colored light emitting loads. The capacitive sensing device can be used to triggering audio, haptics and/or brightness of the light emitting loads in response to touch as a method of training memory and coordination.

Although the loads are generally described as light emitting devices, the capacitive sensing devices described herein can be used to add capacitive sensing to other non-light emitting electrical loads as well. For example, the capacitive sensing devices can be coupled to a resistive load to add capacitive sensing capabilities. For instance, a capacitive sensing device can be coupled to a thermocouple, and used to control the thermocouple to turn on an off based on touch.

In some implementations, the load can be an electric motor and the capacitive sensing device can be used to add capacitive touch sensing to terminals of the motor. For example, the capacitive sensing device can be used to add touch input to a motor for controlling the operation of the motor. For example, capacitive touch sensing devices as described herein can be used to at touch input to motors that control robotic devices. For instance, a capacitive touch sensing device can be added to servo or stepper motors used to move a robotic arm. A user may then control the motors in the arm by touching the links (e.g., insulated electrical connections along the link) to control the operation of the motor.

Embodiments of the invention and all of the functional operations described in this specification may be implemented in digital electronic circuitry, or in computer software, firmware, or hardware, including the structures disclosed in this specification and their structural equivalents, or in combinations of one or more of them. Embodiments of the invention may be implemented as one or more computer program products, i.e., one or more modules of computer program instructions encoded on a computer-readable medium for execution by, or to control the operation of, a microprocessor or microcontroller. The computer readable medium may be a non-transitory computer readable storage medium, a machine-readable storage device, a machine-readable storage substrate, a memory device, a composition of matter effecting a machine-readable propagated signal, or a combination of one or more of them. The term "data processing apparatus" encompasses all apparatus, devices, and machines for processing data, including by way of example a programmable processor, a computer, or multiple processors or computers. The apparatus may include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal that is generated to encode information for transmission to suitable receiver apparatus.

A computer program (also known as a program, software, software application, script, or code) may be written in any form of programming language, including compiled or interpreted languages, and it may be deployed in any form, including as a stand-alone program or as a module, component, subroutine, or other unit suitable for use in a computing environment. A computer program does not necessarily correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one computer or on multiple computers that are located at one site or distributed across multiple sites and interconnected by a communication network.

The processes and logic flows described in this specification may be performed by one or more programmable processors executing one or more computer programs to perform functions by operating on input data and generating output. The processes and logic flows may also be performed by, and apparatus may also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer may be embedded in another device, e.g., a tablet computer, a mobile telephone, a personal digital assistant (PDA), a mobile audio player, a Global Positioning System (GPS) receiver, to name just a few. Computer readable media suitable for storing computer program instructions and data include all forms of non-volatile memory, media, and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory may be supplemented by, or incorporated in, special purpose logic circuitry.

While this specification contains many specifics, these should not be construed as limitations on the scope of the invention or of what may be claimed, but rather as descriptions of features specific to particular embodiments of the invention. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems may generally be integrated together in a single software product or packaged into multiple software products.

Thus, particular embodiments of the invention have been described. Other embodiments are within the scope of the following claims. For example, the actions recited in the claims may be performed in a different order and still achieve desirable results.

What is claimed is:

1. A capacitive sensing device comprising:
   a first switch electrically coupled between a first terminal of a load and a first terminal of a power source;
   a second switch electrically coupled between a second terminal of the load and a second terminal of a power source;
   a capacitive sensing circuit electrically coupled to the first terminal of the load and configured to provide an output signal that indicates a capacitance of the load, the capacitive sensing circuit comprising:
   an isolation circuit configured to protect the capacitive sensing circuit from a high voltage of the power source,
   a sensor drive signal generator electrically coupled to the load through a first terminal of the isolation circuit,
   an AC rectifying circuit coupled to the load through a second terminal of the isolation circuit,
   an RC circuit coupled to the AC rectifying circuit, wherein the output signal that indicates a capacitance of the load is provided as an output from the RC circuit, and
   a reset circuit coupled to the RC circuit; and
   control circuitry configured to perform operations comprising:
   connecting the load to the power source by controlling the first and second switches to close during a first portion of a switching cycle;
   disconnecting the load from the power source by controlling the first and second switches to open during a second portion of the switching cycle, thereby, permitting the load to be at floating voltage;
   resetting, during the second portion of the switching cycle, the capacitive sensing circuit by providing a reset signal to the reset circuit of the capacitive sensing circuit;
   detecting, during the second portion of the switching cycle, the capacitance of the load based on the output signal of the capacitive sensing circuit.

2. The device of claim 1, wherein a load driving signal provided by the power source has a voltage that exceeds a voltage tolerance of the capacitive sensing circuit.

3. The device of claim 1, wherein the load is an electro luminescent (EL) device.

4. The device of claim 1, further comprising a voltage reduction circuit coupled between the power source and the control circuitry, and wherein the control circuitry is configured to sense a load driving signal supplied by the power source and synchronize the switching cycle with the load driving signal.

5. An electronic device comprising:
   a first switch electrically coupled between a first terminal of a load and a first terminal for a power source;
   a second switch electrically coupled between a second terminal of the load and a second terminal for a power source;
   a capacitive sensing circuit electrically coupled to the first terminal of the load and configured to provide an output signal that indicates a capacitance of the load, the capacitive sensing circuit comprising an isolation circuit configured to protect the capacitive sensing circuit from a high voltage of the power source; and
   control circuitry configured to perform operations comprising:
   connecting the load to the first and second power source terminals by controlling the first and second switches to close during a first portion of a switching cycle;
   disconnecting the load from the first and second power source terminals by controlling the first and second switches to open during a second portion of the switching cycle; and
   detecting, during the second portion of the switching cycle, the capacitance of the load based on the output signal of the capacitive sensing circuit.

6. The device of claim 5, wherein the operations of the control circuitry further comprise altering an operation of the load based on the capacitance of the load.

7. The device of claim 5, wherein a value of the capacitance indicates a touch input to the load.

8. The device of claim 5, wherein the switching cycle is synchronized with a frequency of a load driving signal supplied by the power source.

9. The device of claim 5, wherein the switching cycle is between 50 Hz and 150 Hz.

10. The device of claim 5, wherein a load driving signal supplied by the power source is between 60 Hz and 3 kHz.

11. The device of claim 5, wherein the capacitive sensing circuit comprises:
    a sensor drive signal generator; and
    a peak detection circuit configured to convert a sensor drive signal supplied by the sensor drive signal generator into a direct current (DC) output signal that represents the capacitance of the load.

12. The device of claim 11, wherein the isolation circuit is configured to isolate the sensor drive signal generator and the peak detection circuit from a load driving signal supplied by the power source and to permit the sensor driving signal to pass to the load.

13. The device of claim 11, wherein the sensor drive signal has a frequency that is greater than a frequency of the load driving signal supplied by the power source, and
    wherein the isolation circuit is a high pass filter.

14. The device of claim 11, wherein the sensor drive signal generator is an output of the control circuitry.

15. The device of claim 5, wherein the operations of the control circuitry further comprise resetting, during the second portion of the switching cycle, the capacitive sensing circuit.

16. The device of claim 5, wherein the capacitive sensing circuit comprises:

a sensor drive signal generator electrically coupled to the load through a first terminal of the isolation circuit;
an AC rectifying circuit coupled to the load through a second terminal of the isolation circuit;
an RC circuit coupled to the AC rectifying circuit; and
a reset circuit coupled to the RC circuit,
wherein the output signal that indicates a capacitance of the load is provided as an output from the RC circuit.

17. The device of claim 5, wherein a load driving signal provided by the power source has a voltage that exceeds a voltage tolerance of the capacitive sensing circuit.

18. The device of claim 5, wherein the load is an electro luminescent (EL) device.

19. The device of claim 5, wherein the load is an organic light-emitting diode (OLED) device.

20. A method of making a capacitive sensing device, the method comprising:
electrically coupling a first switch between a first terminal of a load and a first terminal for a power source;
electrically coupling a second switch between a second terminal of the load and a second terminal for a power source;
electrically coupling a capacitive sensing circuit to the first terminal of the load, the capacitive sensing circuit configured to provide an output signal that indicates a capacitance of the load, and the capacitive sensing circuit comprising an isolation circuit configured to protect the capacitive sensing circuit from a high voltage of the power source; and
electrically coupling control circuitry to the first switch, second switch, and capacitive sensing circuit configured,
wherein the control circuitry is configured to perform operations comprising:
connecting the load to the power source by controlling the first and second switches to close during a first portion of a switching cycle;
disconnecting the load from the power source by controlling the first and second switches to open during a second portion of the switching cycle, thereby, permitting the load to be at floating voltage;
resetting, during the second portion of the switching cycle, the capacitive sensing circuit; and
detecting, during the second portion of the switching cycle, the capacitance of the load based on the output signal of the capacitive sensing circuit.

* * * * *